United States Patent
Kaelberer et al.

(10) Patent No.: US 10,427,937 B2
(45) Date of Patent: Oct. 1, 2019

(54) METHOD FOR PRODUCING A MULTILAYER MEMS COMPONENT, AND CORRESPONDING MULTILAYER MEMS COMPONENT

(71) Applicant: Robert Bosch GmbH, Stuttgart (DE)

(72) Inventors: Arnd Kaelberer, Schlierbach (DE); Christian Zielke, Eningen Unter Achalm (DE); Hans Artmann, Boeblingen-Dagersheim (DE); Oliver Breitschaedel, Gomaringen (DE); Peter Borwin Staffeld, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/069,124

(22) PCT Filed: Nov. 30, 2016

(86) PCT No.: PCT/EP2016/079252
§ 371 (c)(1),
(2) Date: Jul. 10, 2018

(87) PCT Pub. No.: WO2017/121535
PCT Pub. Date: Jul. 20, 2017

(65) Prior Publication Data
US 2019/0016590 A1     Jan. 17, 2019

(30) Foreign Application Priority Data
Jan. 15, 2016 (DE) .......................... 10 2016 200 494

(51) Int. Cl.
*B81C 1/00* (2006.01)
*B81B 3/00* (2006.01)

(52) U.S. Cl.
CPC .......... *B81C 1/0069* (2013.01); *B81B 3/0081* (2013.01); *B81C 1/0038* (2013.01);
(Continued)

(58) Field of Classification Search
CPC ..... B81C 1/0069; B81C 99/008; B81C 99/08; B81C 1/00349; B81C 1/00341
See application file for complete search history.

(56) References Cited

U.S. PATENT DOCUMENTS 5,374,564 A     12/1994 Bruel
7,098,047 B2 *   8/2006 Ravi ...................... C23C 16/24
                                                     257/E21.525

(Continued)

FOREIGN PATENT DOCUMENTS

DE     3587210 T2    7/1993
EP     0179491 B1    3/1993

OTHER PUBLICATIONS

International Search Report dated Feb. 7, 2017 of the corresponding International Application PCT/EP2016/079252 filed Nov. 30, 2016.

*Primary Examiner* — William Coleman
(74) *Attorney, Agent, or Firm* — Norton Rose Fulbright US LLP; Gerard Messina

(57) ABSTRACT

A method for manufacturing a multi-layer MEMS component includes: providing a multi-layer substrate that has a monocrystalline carrier layer, a monocrystalline functional layer having a front side and a back side, and a bonding layer located between the back side and the carrier layer; growing a first polycrystalline layer over the front side of the monocrystalline functional layer; removing the monocrystalline carrier layer; and growing a second polycrystalline layer over the back side of the monocrystalline functional layer.

14 Claims, 4 Drawing Sheets

(52) U.S. Cl.
CPC .. *B81C 1/00507* (2013.01); *B81C 2201/0177* (2013.01); *B81C 2201/0191* (2013.01); *B81C 2201/0195* (2013.01)

(56) References Cited

U.S. PATENT DOCUMENTS

| | | |
|---|---|---|
| 2002/0197762 A1 | 12/2002 | Zosel et al. |
| 2004/0248344 A1 | 12/2004 | Partridge et al. |
| 2006/0004289 A1 | 1/2006 | Tian et al. |
| 2014/0144234 A1 | 5/2014 | Tsai et al. |

* cited by examiner a)

b)

c)

METHOD FOR PRODUCING A MULTILAYER MEMS COMPONENT, AND CORRESPONDING MULTILAYER MEMS COMPONENT

CROSS-REFERENCE TO RELATED APPLICATIONS

The present application is the national stage of International Pat. App. No. PCT/EP2016/079252 filed Nov. 30, 2016, and claims priority under 35 U.S.C. § 119 to DE 10 2016 200 494.8, filed in the Federal Republic of Germany on Jan. 15, 2016, the content of each of which are incorporated herein by reference in their entireties.

FIELD OF THE INVENTION

The present invention relates to a method for manufacturing a multi-layer MEMS component and to a corresponding multi-layer MEMS component.

BACKGROUND

Although any micromechanical substrates are usable, the present invention and the problem on which it is based will be explained with reference to silicon-based MEMS wafer substrates. Silicon-based MEMS components have special physical and electrical properties. While the electrical properties depend substantially on doping, physical properties (in particular thermal conductivity) depend on the crystalline nature of the silicon. Monocrystalline silicon, for example, has the highest thermal conductivity (148 W/mK).

Many semiconductor processes require epitaxial growth of a silicon layer onto a substrate wafer or an insulation layer such as an oxide or nitride. While epitaxy on a monocrystalline silicon layer results in monocrystalline growth, epitaxy does not function directly on an amorphous layer such as an oxide or nitride. In such a case it is instead necessary firstly to deposit a seed layer. But because the seed layer cannot be generated in monocrystalline fashion, epitaxy on an oxide also results in a polycrystalline silicon layer.

Layer systems such as a monocrystalline Si/oxide/polycrystalline Si can thus be manufactured without difficulty. It is not possible to manufacture a layer system of polycrystalline silicon/oxide/monocrystalline silicon/oxide/polycrystalline silicon using epitaxy or alternative depositions.

It is known (e.g. from DE 3587210 T2 or EP 0 179 491 B1) to manufacture a monocrystalline Si layer from polycrystalline silicon by laser recrystallization. Special requirements are imposed in this context, however, in terms of the thermal conductivity of the individual layers. Thickness uniformity is moreover limited by the uniformity of the polycrystalline layer.

Silicon direct bonding has been known since 1986 (see e.g. Applied Physics Letters 48, No. 1, 1986, pp. 78-80). Here two wafers are brought into contact under high pressure. Silicon direct bonding also allows layer systems to be bonded directly, for example monocrystalline silicon with polycrystalline silicon or monocrystalline silicon/oxide with polycrystalline silicon, as well as monocrystalline silicon/oxide with monocrystalline silicon. With this method it is also possible to manufacture SOI wafers made of a monocrystalline substrate water, an oxide layer, and a monocrystalline functional layer with little layer thickness fluctuation.

A known alternative to back-side thinning of the silicon substrate by polishing or etching is offered by the "smart cut" method (see, e.g., U.S. Pat. No. 5,374,564). Here a disruption layer is generated at the desired location in the substrate by hydrogen ion implantation; upon subsequent heating, that layer results in cracks so that the wafer can be spalled or split off in that region.

SUMMARY

An example embodiment of the present invention is directed to a method with which monocrystalline layers having little thickness variability (<1%) can be integrated into polycrystalline layer systems. All the individual layers are patterned in this context using known semiconductor processes. The position of the monocrystalline layer within a polycrystalline layer stack can thus be selected without restriction.

A significant feature of the invention is the functional integration of at least one monocrystalline layer between at least two or more polycrystalline layers, the monocrystalline layer not being placed directly in the middle of the layer stack; in other words, different numbers and thicknesses of polycrystalline layers can be applied above and below the monocrystalline silicon layer.

For special applications, the invention offers the great advantage of embedding a thin monocrystalline Si layer between two polycrystalline Si layers, and thus combining the good thermal conductivity (148 W/mK) of the embedded layer, as well as its corresponding mechanical properties. The monocrystalline layer can furthermore be made of enriched or single-isotope silicon-28, whose thermal conduction properties are even more considerably enhanced.

According to a preferred example embodiment, the bonding layer is removed after removal of the monocrystalline carrier layer, and the second polycrystalline layer is grown on the back side of the monocrystalline functional layer.

According to a further preferred example embodiment, the second polycrystalline layer is grown at least partly on the bonding layer. The bonding layer can thus be used as a functional layer.

According to a further preferred example embodiment, the first polycrystalline layer is grown on the front side of the monocrystalline functional layer.

According to a further preferred example embodiment, an insulating layer is formed on the front side, and the second polycrystalline layer is grown on the insulating layer. The insulating layer can serve locally as a sacrificial layer at a later stage.

According to a further preferred example embodiment, the monocrystalline functional layer is patterned into several functional regions between which passthrough holes to the bonding layer are formed, an insulating layer being formed on the functional regions and in the passthrough holes, and a further passthrough hole being formed in the insulating layer in order to expose a functional region on the front side. Simple electrical contacting and insulation are thus enabled.

According to a further preferred example embodiment, the first polycrystalline layer is deposited onto the insulating layer, and in the same step a monocrystalline region is formed within the first polycrystalline layer on the exposed functional layer as a front-side electrical contact region. It is thereby possible to form a contact region together with the first polycrystalline layer.

According to a further preferred example embodiment, after removal of the monocrystalline carrier layer, the bonding layer is patterned in such a way that a functional region on the back side is exposed, and the second polycrystalline layer is deposited onto the bonding layer; and in the same step a monocrystalline region is formed within the second polycrystalline layer on the exposed functional region as a back-side electrical contact region. It is thereby possible to form a simple back-side contact region, optionally in conjunction with a front-side contact region.

According to a further preferred example embodiment, an implanted damage region is formed in the monocrystalline carrier layer, the monocrystalline carrier layer being split in the implanted damage region upon removal. This facilitates removal of the carrier layer.

According to a further preferred example embodiment, the multi-layer substrate is an SOI substrate.

Further features and advantages of the present invention will be explained below on the basis of embodiments with reference to the figures.

DETAILED DESCRIPTION

Figure 1:
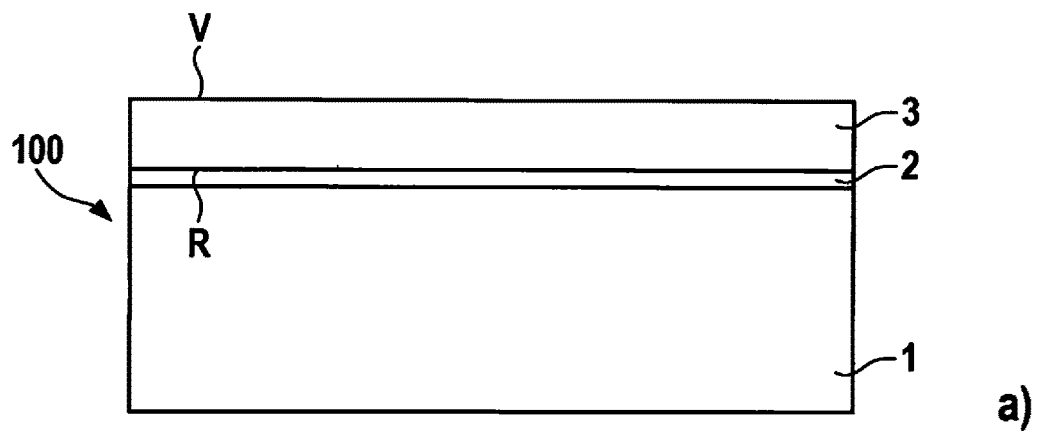
FIGS. 1a)-1c) are schematic perpendicular cross-sectional views to explain a method for manufacturing a multi-layer MEMS component, and a corresponding multi-layer MEMS component, according to a first example embodiment of the present invention.
Figure 1:
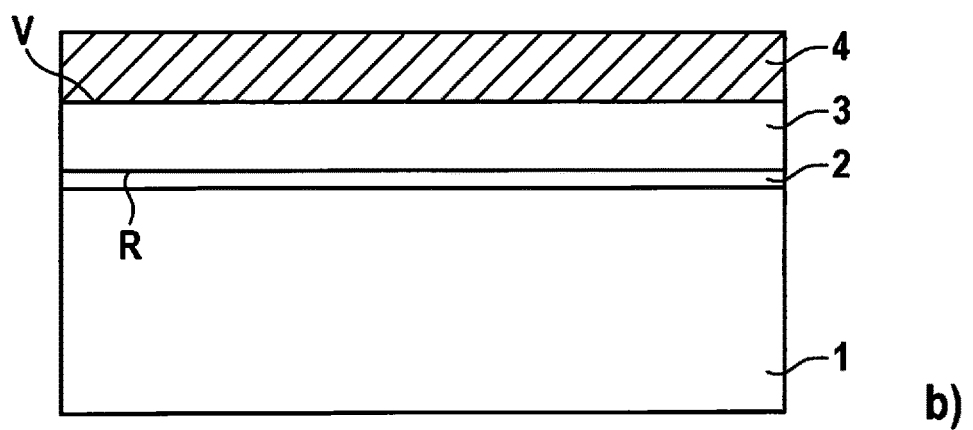
Figure 1:
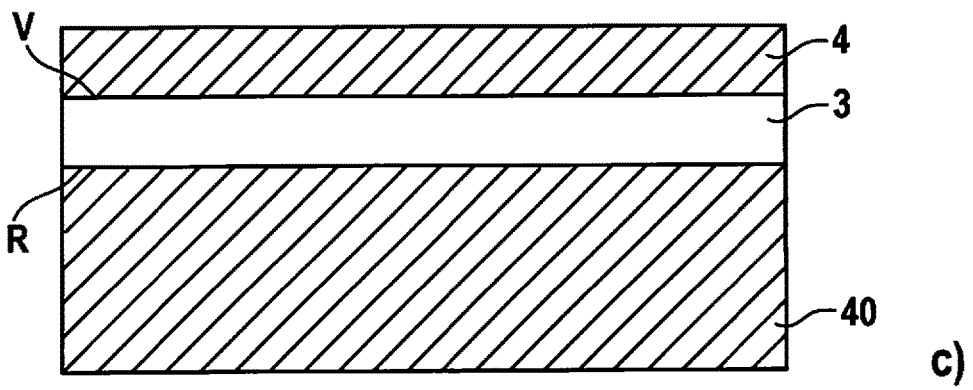

In the figures, identical reference characters refer to identical or functionally identical elements.

FIGS. 1a) to 1c) are schematic perpendicular cross-sectional views to explain a method for manufacturing a multi-layer MEMS component, and a corresponding multi-layer MEMS component, in accordance with a first example embodiment of the present invention.

In FIG. 1a), reference character 100 designates an SOI (silicon-on-insulator) substrate that has a monocrystalline carrier layer 1, a bonding layer 2 made of silicon dioxide, and a monocrystalline functional layer 3 that is connected via bonding layer 2 to carrier layer 1. Monocrystalline functional layer 3 has a front side V and a back side R, and usually serves to have passive and/or active micromechanical components embodied within it.

Carrier layer 1 typically has a thickness of a few hundred micrometers, whereas functional layer 3 has a thickness of typically a few hundred nanometers to a few tens of micrometers.

According to FIG. 1b), a polycrystalline silicon layer 4 is grown onto front side V of monocrystalline functional layer 3.

In a subsequent process step that is illustrated in FIG. 1c), monocrystalline carrier layer 1 is then removed, down to bonding layer 3 made of silicon, by back-side thinning using chemical mechanical polishing (CMP) and/or back-side etching. In a further separate etching step, bonding layer 2 is then likewise removed.

In a concluding process step, a second polycrystalline layer made of polysilicon 40 is then grown onto back side R of monocrystalline functional layer 3.

What therefore exists in the state shown in FIG. 1c) is a layer sequence in which monocrystalline functional layer 3 is embedded between the two polycrystalline layers 4, 40.

Polycrystalline layers 4, 40 can have different thicknesses, for example first polycrystalline layer 4 a thickness in the range from a few hundred nanometers to a few tens of micrometers, and polycrystalline layer 40 a thickness in the range from 50 to 200 micrometers.

Figure 2:
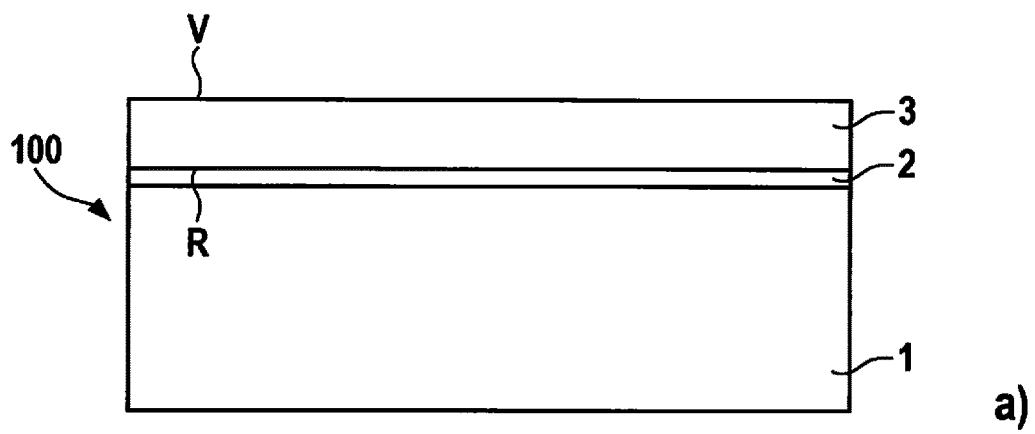
FIGS. 2a)-2c) are schematic perpendicular cross-sectional views to explain a method for manufacturing a multi-layer MEMS component, and a corresponding multi-layer MEMS component, according to a second example embodiment of the present invention.
Figure 2:
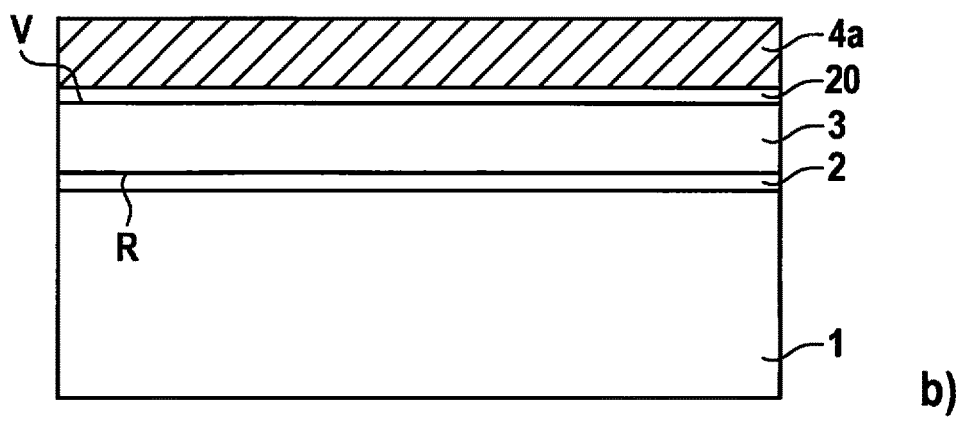
Figure 2:
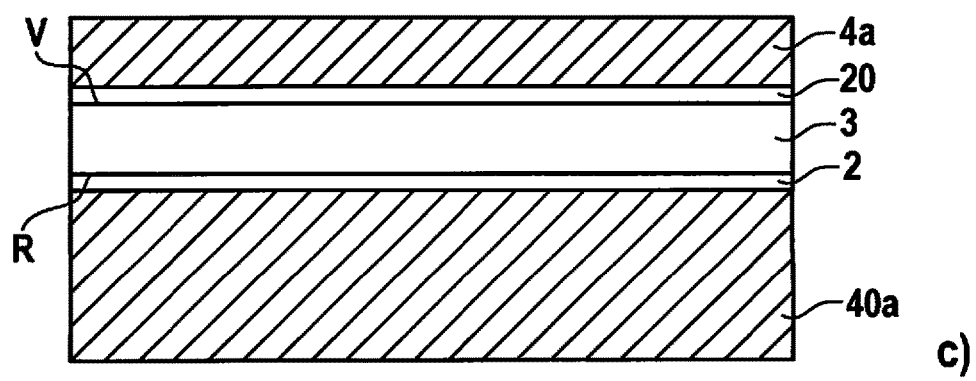

FIGS. 2a) to 2c) are schematic perpendicular cross-sectional views to explain a method for manufacturing a multi-layer MEMS component, and a corresponding multi-layer MEMS component, in accordance with a second example embodiment of the present invention.

In the second embodiment, the initial state according to FIG. 2a) corresponds to the initial state according to FIG. 1a). Unlike in the first embodiment described above, according to FIG. 2b), an insulating layer 20 made of silicon dioxide is then deposited onto front side V of monocrystalline functional layer 3. Subsequently thereto, a first polycrystalline functional layer 4a made of silicon is grown onto insulating layer 20.

Referring now to FIG. 2c), in this embodiment only monocrystalline carrier layer 1 is removed by back-side polishing or back-side etching, while bonding layer 2 made of silicon dioxide is left on the back side of monocrystalline functional layer 3.

Lastly, in a subsequent process step, second polycrystalline layer 40a made of silicon is grown onto bonding layer 2.

Unlike in the first embodiment, here monocrystalline functional layer 3 is therefore separated by insulating layers 2, 20 from polysilicon layers 40a, 4 or 4a.

Figure 3:
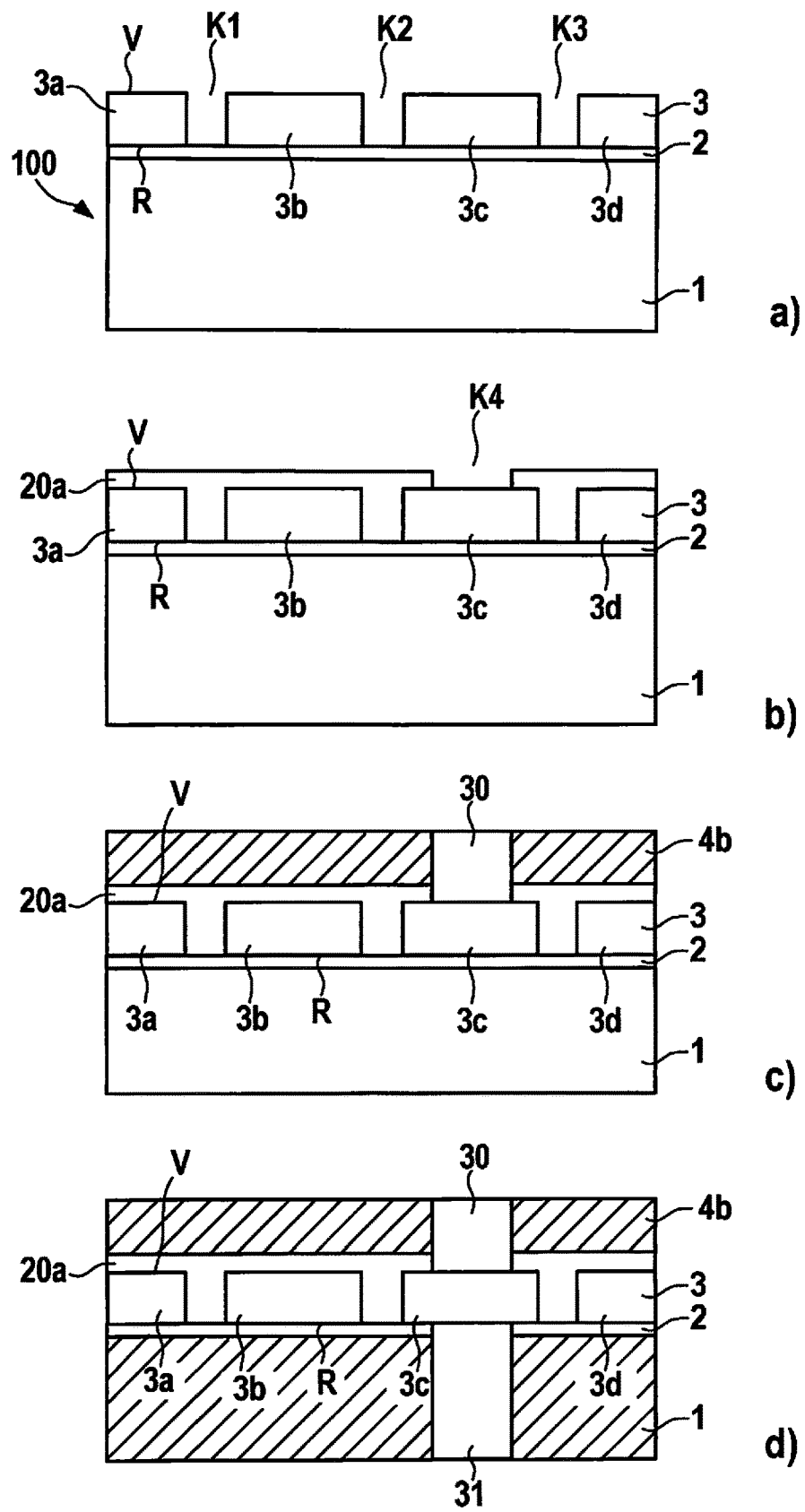
FIGS. 3a)-3d) are schematic perpendicular cross-sectional views to explain a method for manufacturing a multi-layer MEMS component, and a corresponding multi-layer MEMS component, according to a third example embodiment of the present invention.

FIGS. 3a) to 3d) are schematic perpendicular cross-sectional views to explain a method for manufacturing a multi-layer MEMS component, and a corresponding multi-layer MEMS component, in accordance with a third embodiment of the present invention.

According to FIG. 3a), starting from the process state according to FIG. 1a), monocrystalline functional layer 3 is patterned into several functional regions 3a, 3b, 3c, 3d. Functional regions 3a, 3b, 3c, 3d can, for example, later become contact regions or sensor regions or actuator regions of a corresponding micromechanical structure. In a process step that is not depicted, for example, they can also be made movable by partial removal of bonding layer 2.

Functional regions 3a, 3b, 3c, 3d are separated by passthrough holes K1, K2, K3 that extend to the upper side of bonding layer 2 and correspondingly expose it within passthrough holes K1, K2, K3.

As depicted in FIG. 3b), in a subsequent process step an insulating layer 20a made of silicon dioxide is deposited over the structure as shown in FIG. 1a) and patterned. Insulating layer 20a fills passthrough holes K1, K2, K3 with the result that functional regions 3a, 3b, 3c, 3d become embedded. In a patterning step subsequent thereto, a further passthrough hole K4 is formed in insulating layer 20a in order to expose functional region 3c on its front side V.

Subsequently thereto, as shown in FIG. 3c), a first polycrystalline layer 4b is deposited onto insulating layer 20a; in the same process step, a monocrystalline region 30 is formed within first polycrystalline layer 4b, on the exposed functional region 3c, as a front-side electrical contact region.

Lastly, referring to FIG. 3d), as in the second embodiment, monocrystalline carrier layer 1 is removed and bonding layer 2 is patterned in such a way that functional region 3c on back side R is exposed. A second polycrystalline silicon layer 40d is then deposited onto bonding layer 2 and onto the exposed contact region 3c; analogously to front side V, a monocrystalline region 31 that functions as a back-side electrical contact region is formed on back side R of functional region 3c.

Functional region 3c is thus contacted on the front side and back side, while functional regions 3a, 3b, 3d are completely embedded in insulating layer 20a.

Further process steps that are not depicted here in more detail could involve, for example, making certain functional regions movable as mentioned above. Also not depicted here are further process steps for electrical connection, for example by way of corresponding metal contacts and conductor paths or the like.

Figure 4:
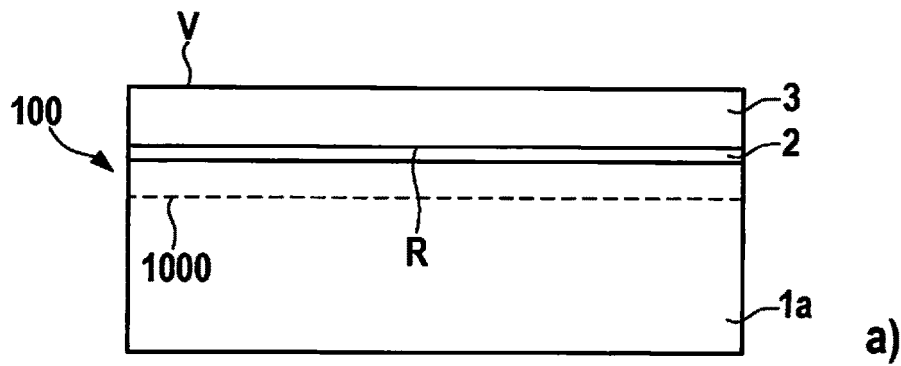
FIGS. 4a)-4d) are schematic perpendicular cross-sectional views to explain a method for manufacturing a multi-layer MEMS component, and a corresponding multi-layer MEMS component, according to a fourth example embodiment of the present invention.
Figure 4:
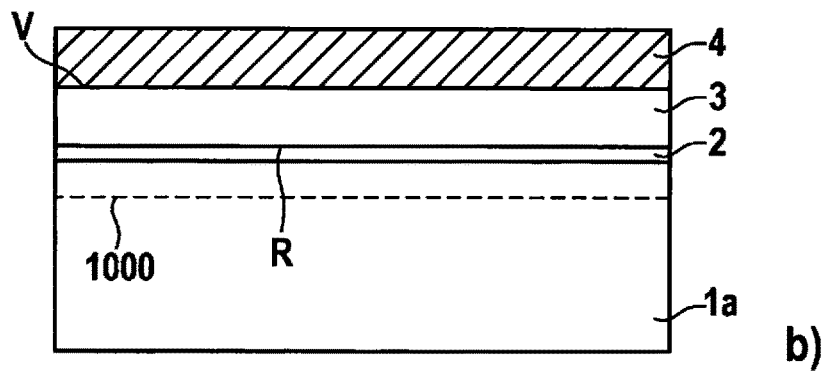
Figure 4:
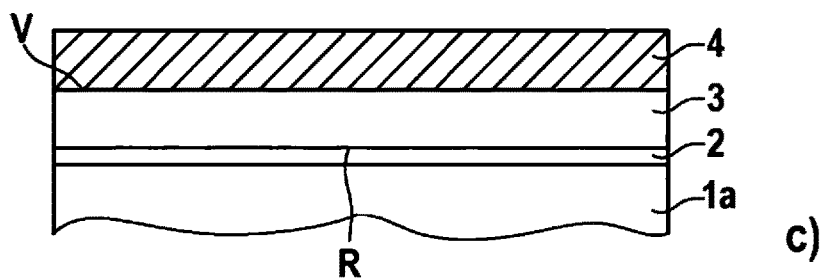
Figure 4:
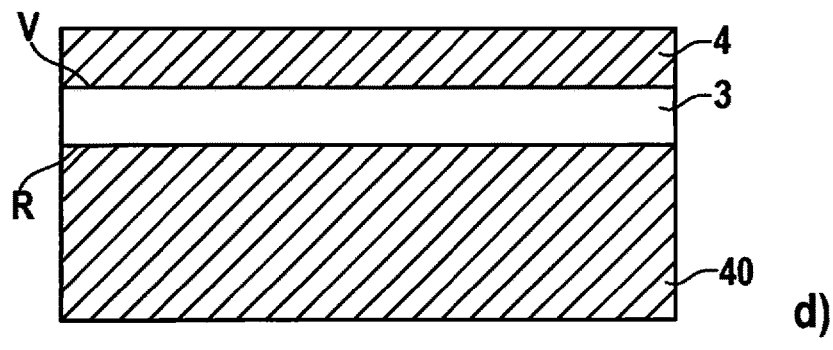

FIGS. 4a) to 4d) are schematic perpendicular cross-sectional views to explain a method for manufacturing a multi-layer MEMS component, and a corresponding multi-layer MEMS component, in accordance with a fourth example embodiment of the present invention.

In the fourth embodiment according to FIG. 4a), once again an SOI substrate 100 is used, but an implanted damage layer 1000, located as close as possible to bonding layer 2, is formed in monocrystalline carrier layer 1a. An implanted damage layer 1000 of this kind encompasses a disrupted crystal structure that can be utilized for a subsequent "smart cut."

Referring now to FIG. 4b), the first polycrystalline layer made of silicon 4 is formed on monocrystalline functional layer 3.

Subsequent to the process state shown in FIG. 4b), a thermal treatment then occurs at high temperature (typically 1000° C.), monocrystalline carrier layer 1a being split in the region of implanted damage region 1000; this results in the process state according to FIG. 4c).

Referring now to FIG. 4d), the remainder of monocrystalline carrier layer 1a is etched or polished away, and subsequent thereto bonding layer 2 is etched away.

Analogously to the first embodiment described above, the second polycrystalline functional layer 40 is then deposited onto back side R of monocrystalline functional layer 3, so that the process state according to FIG. 4d) corresponds to the process state according to FIG. 1c).

This "smart cut" method on monocrystalline carrier layer 1a can be utilized in all of the embodiments described above.

Although the present invention has been described on the basis of preferred exemplifying embodiments, it is not limited thereto. In particular, the aforesaid materials and topologies are merely exemplifying and are not limited to the examples explained.

In particular, the geometry of the layers is depicted in highly simplified fashion, but the invention can be applied to substantially more complex geometries.

The layers discussed by way of example are also not limited to the layers mentioned, but can instead be implemented by way of any combinations of polycrystalline layers and monocrystalline layers.

What is claimed is:

1. A method for manufacturing a multi-layer MEMS component, the method comprising:
providing a multi-layer substrate that includes a monocrystalline carrier layer, a monocrystalline functional layer with a front side and a back side, and a bonding layer located between the back side and the carrier layer;
growing a first polycrystalline layer over the front side of the monocrystalline functional layer;
removing the monocrystalline carrier layer; and
growing a second polycrystalline layer over the back side of the monocrystalline functional layer.

2. The method of claim 1, further comprising:
removing the bonding layer after the removal of the monocrystalline carrier layer, wherein the second polycrystalline layer is grown on the back side of the monocrystalline functional layer after the removal of the bonding layer.

3. The method of claim 1, wherein the second polycrystalline layer is grown at least partly on the bonding layer.

4. The method of claim 1, further comprising:
after the removal of the monocrystalline carrier layer, patterning the bonding layer, thereby exposing a functional region at the back side, wherein the second polycrystalline layer is deposited onto the bonding layer; and
forming a monocrystalline region the second polycrystalline layer on the exposed functional region as a back-side electrical contact region.

5. The method of claim 1, wherein the first polycrystalline layer is grown on the front side of the monocrystalline functional layer.

6. The method of claim 1, further comprising:
forming an insulating layer on the front side, wherein the second polycrystalline layer is grown on the insulating layer.

7. The method of claim 1, further comprising:
patterning the monocrystalline functional layer into a plurality of functional regions between which passthrough holes to the bonding layer are formed;
forming an insulating layer on the functional regions and in the passthrough holes; and
forming a passthrough hole in the insulating layer, thereby exposing a functional region on the front side.

8. The method of claim 7, wherein the first polycrystalline layer is deposited onto the insulating layer, the method further comprising forming a monocrystalline region within the first polycrystalline layer on the exposed functional layer as a front-side electrical contact region.

9. The method of claim 1, further comprising:
forming an implanted damage region in the monocrystalline carrier layer, wherein the monocrystalline carrier layer is split in the implanted damage region when the monocrystalline carrier layer is removed.

10. The method of claim 1, wherein the multi-layer substrate is an SOI substrate.

11. A multi-layer MEMS component, comprising:
a first polycrystalline layer over a front side of a monocrystalline functional layer; and
a second polycrystalline layer over a back side of the monocrystalline functional layer;
wherein the bonding layer is patterned such that a functional region is exposed on the back side, the second polycrystalline layer is formed on the bonding layer, and a monocrystalline region is formed within the second polycrystalline layer on the exposed functional region as a back-side electrical contact region.

12. The multi-layer MEMS component of claim 11, wherein the first polycrystalline layer, the monocrystalline functional layer, and the second polycrystalline layer are formed from silicon.

13. A multi-layer MEMS component, comprising:
- a first polycrystalline layer over a front side of a monocrystalline functional layer; and
- a second polycrystalline layer over a back side of the monocrystalline functional layer;
- wherein the monocrystalline functional layer is patterned such that the functional layer includes a plurality of functional regions between which there are passthrough holes to the bonding layer,
- wherein the component further comprises an insulating layer on the functional regions and in the passthrough holes, and
- wherein a passthrough hole is formed in the insulating layer, by which a functional region is exposed on the front side.

14. The multi-layer MEMS component of claim 13, wherein the first polycrystalline layer is formed on the insulating layer, and a monocrystalline region is formed within the first polycrystalline layer on the exposed functional layer as a front-side electrical contact region.

* * * * *